United States Patent
Miura et al.

(10) Patent No.: US 10,763,757 B2
(45) Date of Patent: Sep. 1, 2020

(54) POWER CONVERTER

(71) Applicant: DENSO CORPORATION, Kariya, Aichi-pref. (JP)

(72) Inventors: Tomoya Miura, Kariya (JP); Kenichi Oohama, Kariya (JP); Shintaro Kogure, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/515,437

(22) Filed: Jul. 18, 2019

(65) Prior Publication Data

US 2020/0028443 A1 Jan. 23, 2020

(30) Foreign Application Priority Data

Jul. 19, 2018 (JP) ................................. 2018-135997

(51) Int. Cl.
| | |
|---|---|
| *H02M 7/00* | (2006.01) |
| *H01L 23/473* | (2006.01) |
| *H01L 25/065* | (2006.01) |
| *H02P 5/74* | (2006.01) |
| *H02M 7/5387* | (2007.01) |

(52) U.S. Cl.
CPC .......... *H02M 7/003* (2013.01); *H01L 23/473* (2013.01); *H01L 25/0657* (2013.01); *H02M 7/5387* (2013.01); *H02P 5/74* (2013.01)

(58) Field of Classification Search
CPC . H02M 7/003; H02M 7/5387; H01L 25/0657; H01L 23/473; H02P 5/74
See application file for complete search history.

(56) References Cited

U.S. PATENT DOCUMENTS

| | | | | |
|---|---|---|---|---|
| 2011/0127061 A1* | 6/2011 | Gotou | ................... | H02M 7/003 |
| | | | | 174/68.2 |
| 2014/0355221 A1* | 12/2014 | Sawada | .................... | H02G 5/02 |
| | | | | 361/735 |
| 2016/0106011 A1* | 4/2016 | Mizuno | .............. | H05K 7/20927 |
| | | | | 361/699 |
| 2016/0128216 A1* | 5/2016 | Harada | ................ | H05K 7/1432 |
| | | | | 361/728 |
| 2016/0315549 A1* | 10/2016 | Harada | ................ | H05K 7/1432 |
| 2018/0358903 A1* | 12/2018 | Takahashi | ........... | H02M 7/5387 |
| 2019/0013744 A1* | 1/2019 | Mochiki | ................. | H02P 27/06 |
| 2019/0036282 A1* | 1/2019 | Tanabe | ................ | H01L 23/4012 |

* cited by examiner

*Primary Examiner* — Victor A Mandala

(74) *Attorney, Agent, or Firm* — Oliff PLC

(57) ABSTRACT

In a power converter, an insulation member is interposed between a first overlap portion of the near DC busbar and a second overlap portion of the far DC busbar in a protrusion direction. The first overlap portion is located closer to the converter component in the protrusion direction than the second overlap portion is. A near DC terminal is arranged to be closer to the first and second overlap portions than a far DC terminal is in an arrangement direction perpendicular to both the stack and protrusion directions. The near and far DC busbars are joined to the respective near and far DC terminals. The far DC busbar is joined to the far DC terminals of the respective semiconductor modules while bypassing the near DC terminals of the respective semiconductor modules.

10 Claims, 12 Drawing Sheets

POWER CONVERTER

CROSS-REFERENCE TO RELATED APPLICATION

This application is based on and claims the benefit of priority from earlier Japanese Patent Application No. 2018-135997 filed Jul. 19, 2018, the description of which is incorporated herein by reference.

TECHNICAL FIELD

The present invention relates to power converters each including a pair of direct-current (DC) busbars, and a semiconductor module with a built-in semiconductor element.

BACKGROUND

A known power converter includes a plurality of semiconductor modules each incorporating therein one or more semiconductor elements, such as IGBTs, a plurality of cooling pipes, and a pair of DC busbars.

SUMMARY

According to a first exemplary aspect of the present disclosure, there is provided a power converter including a stack assembly. The stack assembly includes a direct-current busbar assembly.

The direct-current busbar assembly includes a pair of near and far direct-current busbars serving as a current path between a direct-current power source and the semiconductor modules, and an insulation member interposed between a first portion of the near direct-current busbar and a second portion of the far direct-current busbar in the protrusion direction.

The direct-current terminals include a near direct-current terminal, and a far direct-current terminal. The near direct-current terminal is arranged to be closer to the first and second overlap portions than the far direct-current terminal is in a predetermined third direction as an arrangement direction perpendicular to both the stack direction and protrusion direction. The near and far direct-current busbars are joined to the respective near and far direct-current terminals, The far direct-current busbar is configured to be joined to the far direct-current terminals of the respective semiconductor modules while bypassing the near direct-current terminals of the respective semiconductor modules.

This configuration avoids the need for formation of through holes in the near busbar for insertion of the near terminals. This therefore makes it possible to increase the area of each of the pair the direct-current busbars facing the other thereof, resulting in a lower parasitic inductance in the direct-current busbars.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

View Point

A known power converter, an example of which is disclosed in Japanese Patent Application Publication No. 2011-114193, includes a plurality of semiconductor modules each incorporating therein one or more semiconductor elements, such as IGBTs, a plurality of cooling pipes, and a pair of DC busbars. In particular, the semiconductor modules and the cooling pipes are for example alternately stacked to constitute a stack semiconductor assembly.

Each of the semiconductor modules includes a converter component that incorporates therein one or more semiconductor elements, and a pair of DC terminals protruding from the converter component. The DC busbars are arranged to face each other, and connected to the respective DC terminals of each semiconductor module. A DC power source is connected to the DC busbars, so that the DC power source supplies DC power to each semiconductor module via the DC busbars. The above-described power converter is configured to control on-and-off switching operations of the semiconductor elements to thereby convert the DC power supplied from the DC power source into alternating-current (AC) power.

Figure 12:
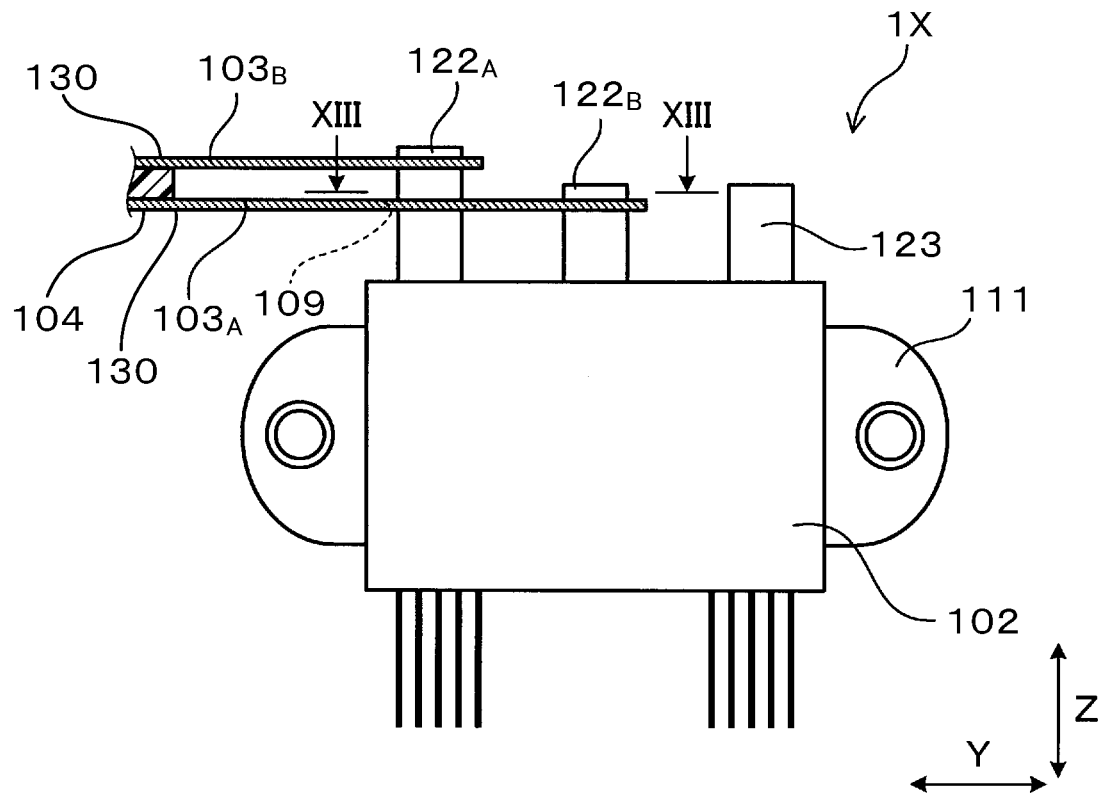
FIG. 12 is a cross-sectional view of principal components of a power converter according to a comparative example.
Figure 13:
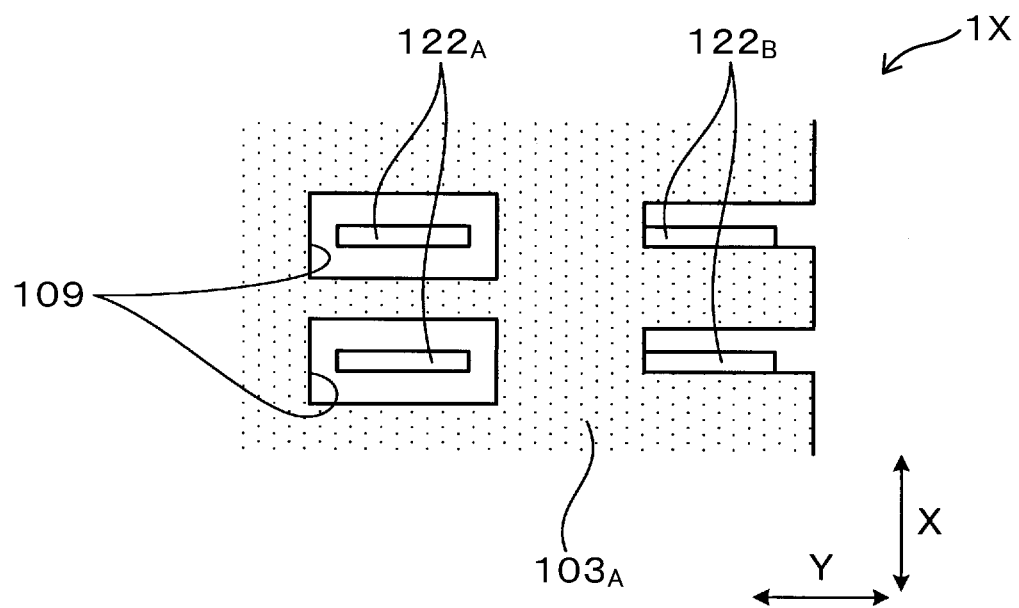
FIG. 13 is a cross-sectional view taken along line XIII-XIII in FIG. 12.

Each DC busbar is comprised of an overlap portion in its protruding direction, i.e. its length direction, and the overlap portions of the DC busbars are overlapped with each other in a direction perpendicular to their length directions while an insulation member is interposed between the overlapped portions (see FIGS. 12 and 13).

The DC busbars include a near busbar and a far busbar; the near busbar is located to be nearer, i.e. closer, to the converter component in the protruding direction thereof than the far busbar to the converter component, and the far busbar is located to be farther from the converter component in the protruding direction thereof than the near busbar is from the converter component.

The DC terminals include a near terminal and a far terminal; the near terminal is located nearer to the overlap portions of the respective DC busbars in their protruding directions than the far terminal thereto, and the far terminal is located farther from the overlap portions of the respective DC busbars in their protruding directions than the near terminal therefrom. The near busbar is connected to the far terminal, and the far busbar is connected to the near terminal.

The near busbar has through holes formed therethrough. The through holes of the near busbar are arranged to face the near terminals of the respective semiconductor modules, so that each near terminal has passed through the corresponding through hole of the near busbar.

The existence of the through holes formed through the near busbar may result in the area of the near busbar, which faces the corresponding area of the far busbar, becoming smaller. This may cause the DC busbars to be likely to have a larger parasitic inductance in at least the near busbar. The existence of the through holes formed through the near busbar may also need an increase in distance between adjacent near terminals of adjacent semiconductor modules, that is, an increase in distance between the adjacent semiconductor modules, in the stack direction of the stacked semiconductor modules and cooling pipes. This aims to prevent two adjacent through holes for the respective adjacent near terminals from being joined to each other in the stack direction. This unfortunately may cause the power converter to be likely to have a larger size.

Additionally, the above known power converter is configured such that each near terminal has passed through the corresponding one of the through holes formed through the near busbar to be joined to the far busbar, resulting in the near terminal being longer than the far terminal (see FIG. 12). This may result in the near terminal to be likely to have a larger parasitic inductance.

From these viewpoints, the present disclosure seeks to provide power converters, each of which is able to feature a smaller size with a DC terminal and/or a DC busbar having a smaller parasitic inductance.

According to a first exemplary aspect of the present disclosure, there is provided a power converter including a stack assembly. The stack assembly includes a plurality of semiconductor modules, and a plurality of cooling pipes for cooling the semiconductor modules. The semiconductor modules and the cooling pipes are stacked in a predetermined first direction as a stack direction to constitute the stack assembly. The stack assembly includes a direct-current busbar assembly.

Each of the semiconductor modules includes a converter component comprising at least one semiconductor element for power conversion, and a pair of direct-current terminals connected to the at least one semiconductor element and configured to protrude from the converter component in a predetermined second direction as a protrusion direction.

The direct-current busbar assembly includes a pair of near and far direct-current busbars serving as a current path between a direct-current power source and the semiconductor modules, and an insulation member interposed between a first portion of the near direct-current busbar and a second portion of the far direct-current busbar in the protrusion direction. The first and second portions of the respective near and far direct-current busbars respectively serve as first and second overlap portions that are overlapped with each other via the insulation member in the protrusion direction. The first overlap portion of the near direct-current busbar is located closer to the converter component in the protrusion direction than the second overlap portion of the far direct-current busbar is.

The direct-current terminals include a near direct-current terminal, and a far direct-current terminal. The near direct-current terminal is arranged to be closer to the first and second overlap portions than the far direct-current terminal is in a predetermined third direction as an arrangement direction perpendicular to both the stack direction and protrusion direction. The near and far direct-current busbars are joined to the respective near and far direct-current terminals, The far direct-current busbar is configured to be joined to the far direct-current terminals of the respective semiconductor modules while bypassing the near direct-current terminals of the respective semiconductor modules.

This configuration avoids the need for formation of through holes in the near busbar for insertion of the near terminals. This therefore makes it possible to increase the area of each of the pair the direct-current busbars facing the other thereof, resulting in a lower parasitic inductance in the direct-current busbars.

Embodiment

The following describes power converters, which are embodiments of the present disclosure, with reference to the accompanying drawings. In the embodiments, similar or equivalent parts between the embodiments, to which like reference characters are assigned, are omitted or simplified to avoid redundant description.

First Embodiment

The following describes a power converter 1 according to the first embodiment of the present disclosure with reference to FIGS. 1 to 8 and FIGS. 12 and 13.

The power converter 1 of the first embodiment serves as, for example, a power converter to be mounted in a vehicle, such as an electric vehicle or a hybrid vehicle.

Figure 1:
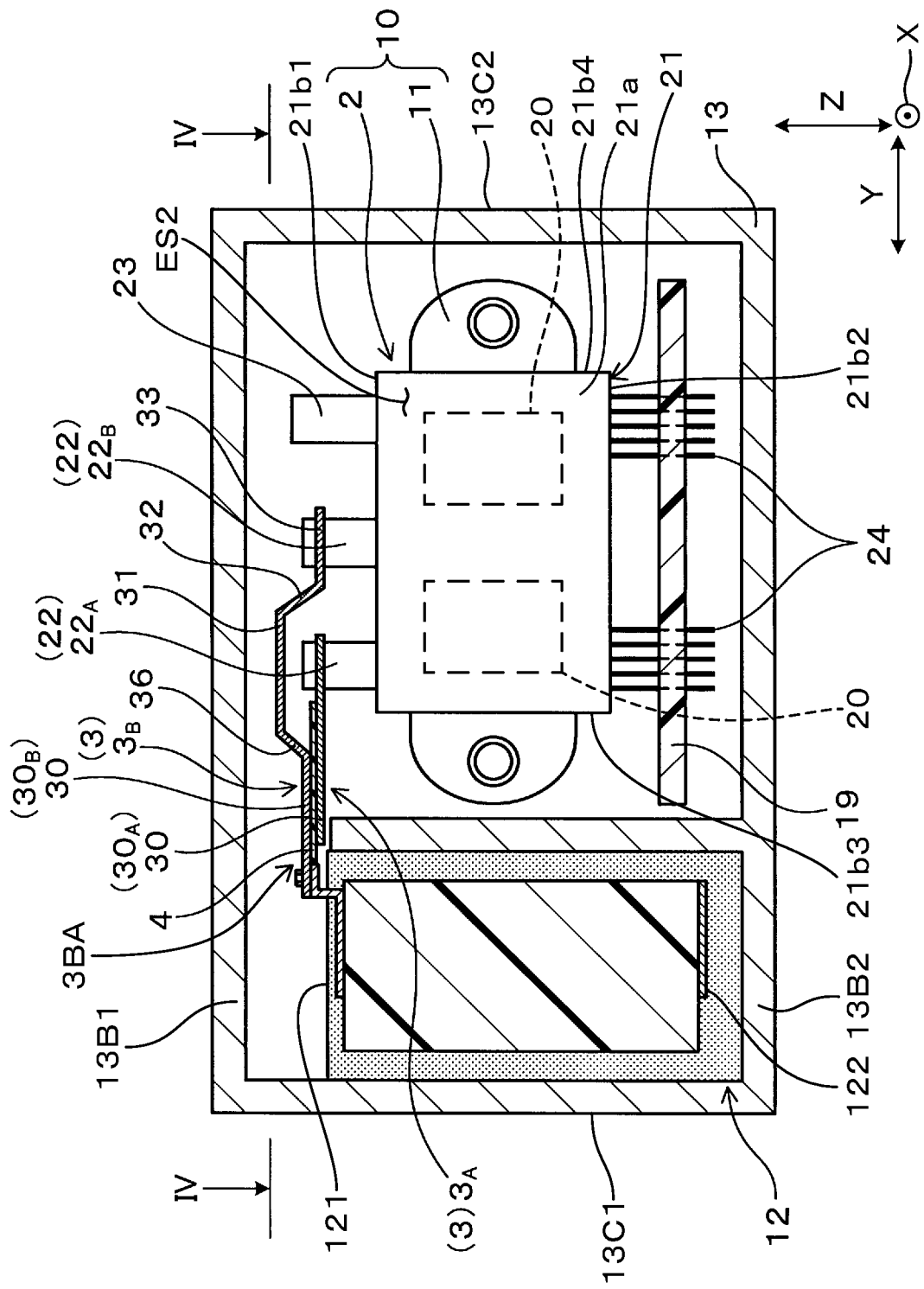
FIG. 1 is a cross-sectional view, which is taken along line I-I of FIG. 4, of a power converter according to the first embodiment of the present disclosure.
Figure 6:
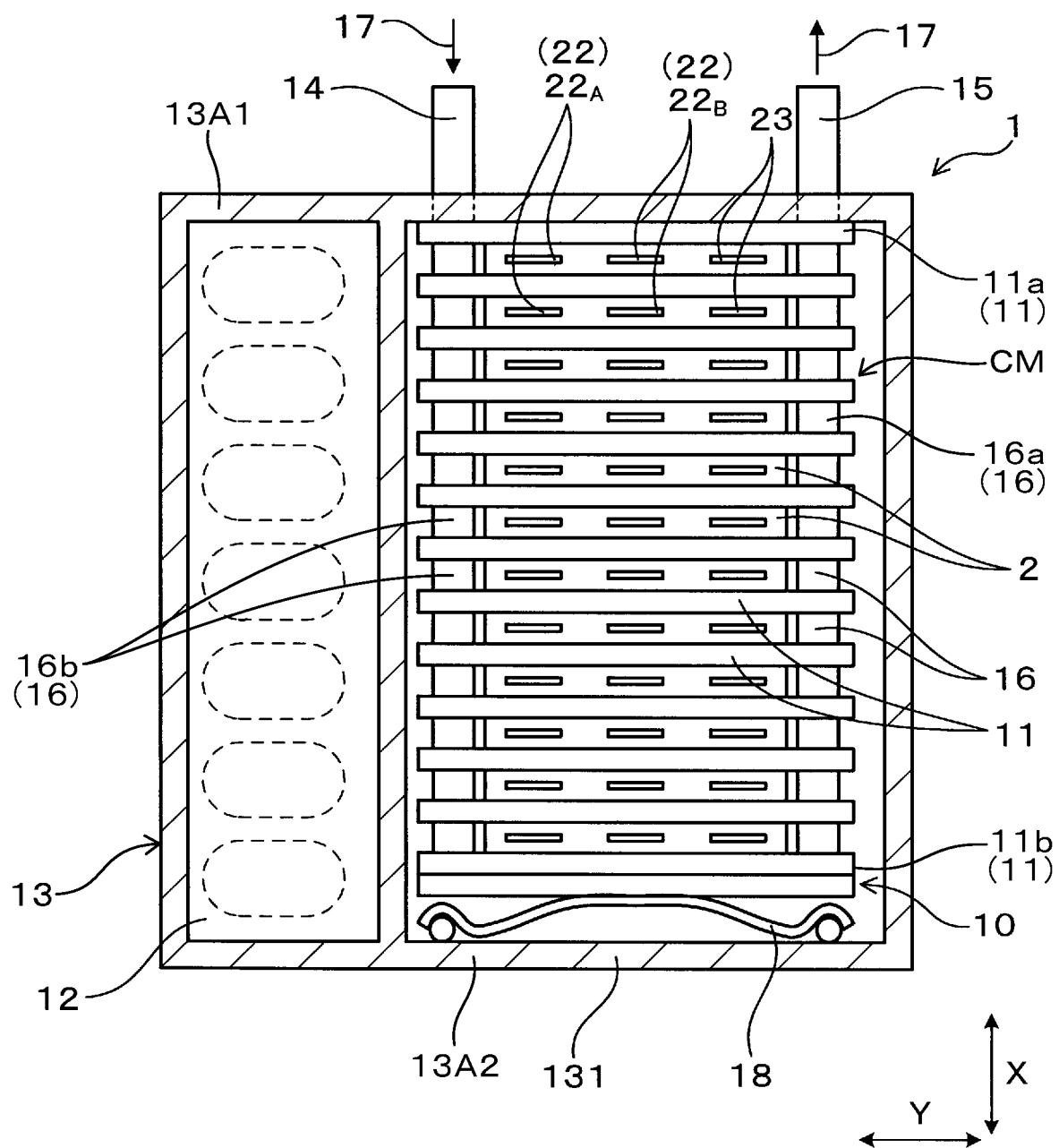
FIG. 6 is a diagram corresponding to FIG. 5 from which a near busbar has been removed.

As illustrated in, for example, FIGS. 1 and 6, the power converter 1 includes a stack assembly 10, a DC busbar assembly 3BA comprised of a pair of DC busbars 3 ($3_A$ and $3_B$), a control circuit board 19, a smoothing capacitor 12, and a housing 13. Note that the DC busbars 3 ($3_A$ and $3_B$) can be collectively called "DC busbars 3" or "DC busbars 3 ($3_A$ and $3_B$), or also individually called "DC busbars $3_A$ and $3_B$ hereinafter.

The stack assembly 10 includes a plurality of semiconductor modules 2 and a plurality of cooling pipes 11. The stack assembly 10 is configured such that the semiconductor modules 2 and the cooling pipes 11 are alternately stacked in a predetermined direction, which will be referred to as an X direction, to have a stack structure. The stack assembly 10 has opposing first and second end surfaces ES1 and ES2 in the X direction.

The smoothing capacitor 12 has opposing positive and negative electrodes 121 and 122 that face each other with a predetermined space therebetween.

The housing 13 has a substantially rectangular parallelepiped shape having a first pair of opposing sidewalls 13A1 and 13A2, a second pair of sidewalls 13B1 and 13B2, and a third pair of sidewalls 13C1 and 13C2. For example, the stack assembly 10 is disposed in the housing 13 such that the first and second surfaces ES1 and ES2 of the stack assembly 10 face the respective sidewalls 13A1 and 13A2, and are disposed to be perpendicular to the X direction (stack direction) (see, for example, FIGS. 1 and 4.

The stack assembly 10 and the smoothing capacitor 12 are disposed to be aligned in a direction, which will be referred to a Y direction, that is perpendicular to the X direction. The direction perpendicular to the X direction and Y direction will be defined as a Z direction hereinafter; this relationship of these X-Z directions is illustrated in, for example, FIG. 1.

Figure 8:
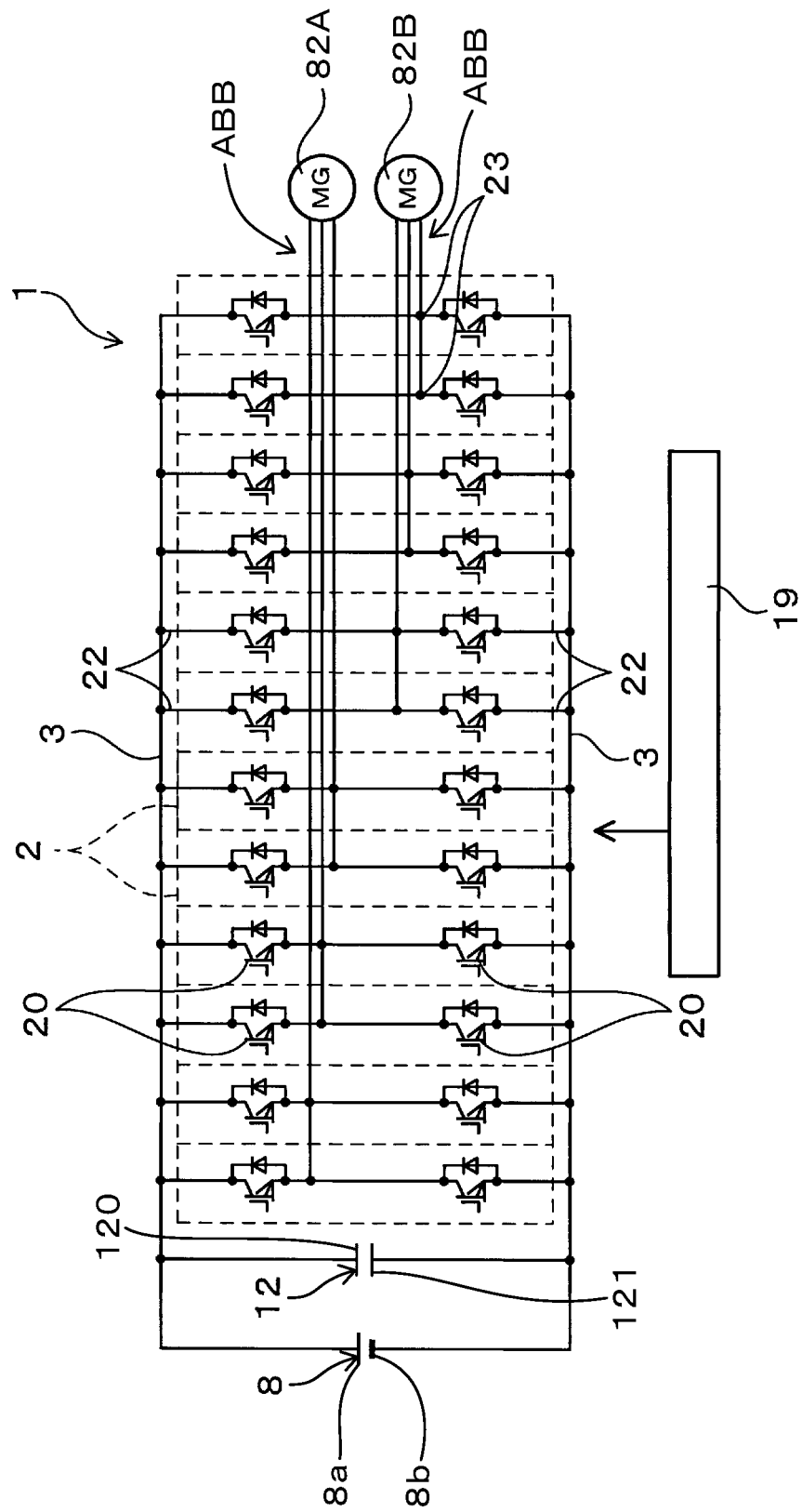
FIG. 8 is a circuit diagram of the power converter illustrated in FIG. 1.

Each of the semiconductor modules 2 incorporates therein a plurality of semiconductor elements 20 (see FIGS. 1 and 8). The cooling pipes 11 cool the semiconductor modules 2. The DC busbars 3 serve as a current path between a DC power source 8 and the semiconductor modules 2.

Specifically, the DC power source 8 has opposing positive and negative terminals 8a and 8b; the positive terminal 8a of the DC power source 8 is connected to the positive electrode 120 of the smoothing capacitor 12, and the positive electrode 121 of the smoothing capacitor 12 is connected to one of the DC busbars 3 (see FIG. 8). Additionally, the negative terminal 8b of the DC power source 8 is connected to the negative electrode 121 of the smoothing capacitor 12, and the negative electrode 121 of the smoothing capacitor 12 is connected to the other of the DC busbars 3.

The stack assembly 10, the DC busbars 3, the smoothing capacitor 12, and the control circuit board 19 are installed in the housing 13 (see, for example, FIG. 1).

Figure 2:
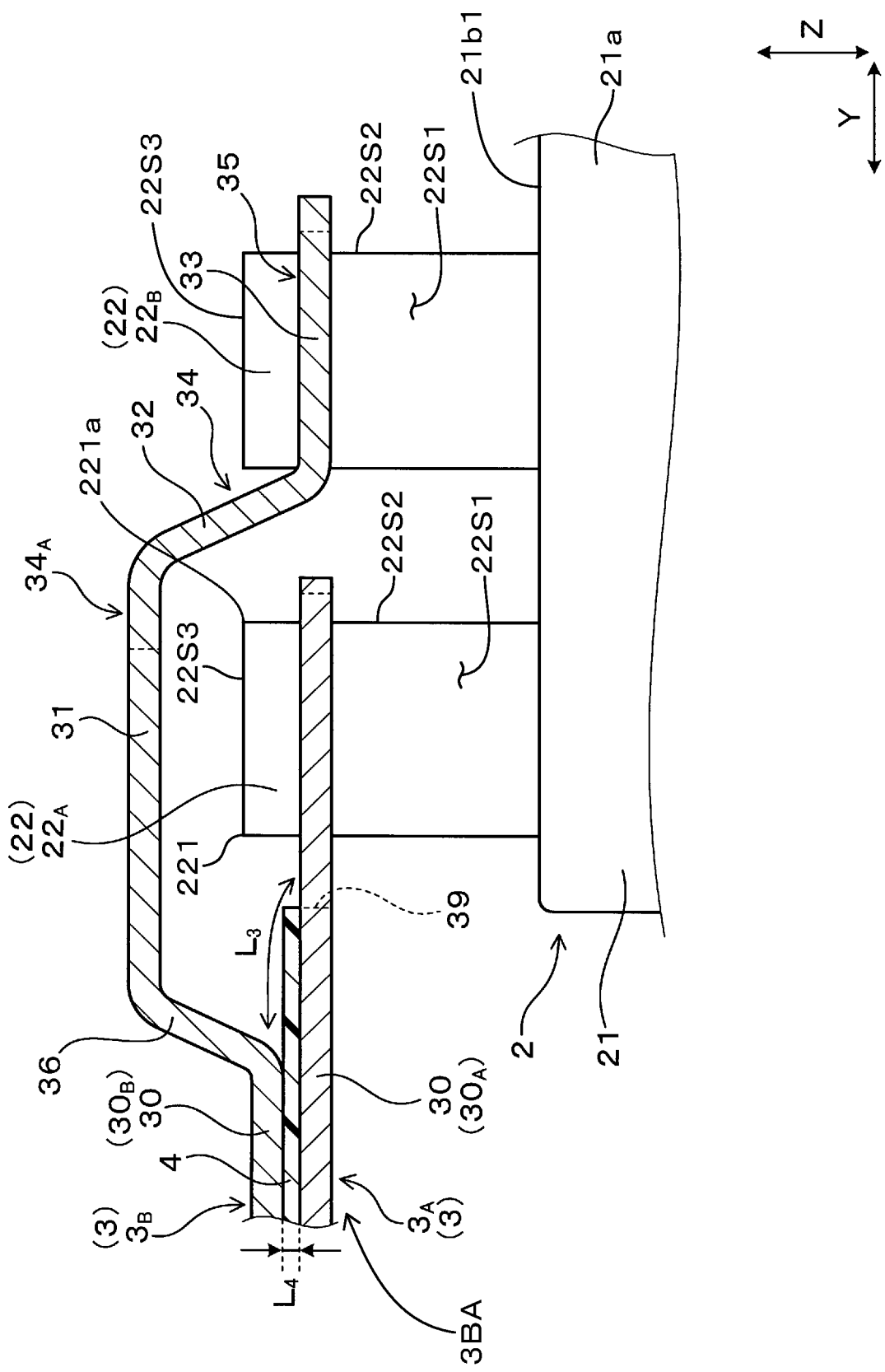
FIG. 2 is an enlarged view of principal components of the power converter illustrated in FIG. 1.

As illustrated in FIG. 1 and FIG. 2, each semiconductor module 2 includes a converter component 21 incorporating therein the semiconductor elements 20, a pair of DC terminals 22 ($22_A$ and $22_B$) protruding from the converter component 21 and connected to the respective DC busbars 3 ($3_A$ and $3_B$), and an AC terminal 23. Note that the DC terminals 22 ($22_A$ and $22_B$) are collectively called "DC terminals 22" or "DC terminals 22 ($22_A$ and $22_B$), or individually called "DC terminals $22_A$ and $22_B$ hereinafter.

Each of the DC terminals 22 has a substantially rectangular thin-plate shape, and has a pair of opposing major sides 22s1, a pair of opposing minor sides 22s2, and an end side 22s3 (see FIG. 2). Each minor side 22s2 meeting the end side 22s3 constitutes a corresponding one of corners, i.e., corner portions 221.

Specifically, the converter component 21 of each semiconductor module 2 is comprised of a substantially rectangular parallelepiped case 21a in which the semiconductor elements 20 are installed. The case 21a of the converter component 21 has opposing major surfaces, opposing major sides, i.e. longitudinal sides, 21b1 and 21b2, and has opposing minor sides, i.e. lateral sides, 21b3 and 21b4. For example, the case 21a of the converter component 21 is arranged such that (1) The major sides 21b1 and 21b2 face the respective sidewalls 13B1 and 13B2 of the housing 13

(2) The minor sides 21b3 and 21b4 face the respective sidewalls 13C1 and 13C2 of the housing 13

The major side 21b1 has opposing first and second ends in the Y direction, and a middle portion between both the first and second ends.

The DC terminal $22_A$ is for example configured to protrude from the first end of the major side 21b1 to extend by a predetermined length in the Z direction, which serves as, for example, a protrusion direction, toward the sidewall 13B1 of the housing 13; the first end is closer to the smoothing capacitor 12 than the second end is. The DC terminal $22_B$ is for example configured to protrude from the middle portion of the major side 21b1 to extend by a predetermined length in the Z direction toward the sidewall 13B1 of the housing 13.

Additionally, the AC terminal 23 is configured to protrude from the second end of the major side 21b1 to extend by a predetermined length in the Z direction toward the sidewall 13B1 of the housing 13.

The busbar assembly 3BA are arranged to extend between the DC terminals 22 of the semiconductor modules 2 and the smoothing capacitor 12 in the Y direction to electrically couple the DC terminals 22 and the smoothing capacitor 12.

Specifically, the busbar assembly 3BA is comprised of the busbar $3_A$ and the busbar $3_B$, each of which has a plate-like shape and has opposing first and second ends in the Y direction, so that the first end of each of the busbars $3_A$ and $3_B$ is closer to the smoothing capacitor 12 than the second end thereof is. The busbar assembly 3BA is also comprised of an insulation member 4 interposed between a portion of the first end of the busbar $3_A$ and a portion of the first end of the busbar $3_B$, so that the portion of the first end of the busbar $3_A$ and the portion of the first end of the busbar $3_B$ are overlapped with each other in the Z direction. The portion of the first end of the busbar $3_A$ and the portion of the first end of the busbar $3_B$, which are overlapped with each other in the Z direction, will be referred to as, for example, overlap portions 30 ($30_A$, $30_B$). That is, the overlap portions 30 of the busbars $3_A$ and $3_B$ are arranged to be closer to the DC terminal $22_A$ of each semiconductor module 2 than to the DC terminal $22_B$ thereof. Note that the overlap portions 30 ($30_A$ and $30_B$) can be collectively called "overlap portions 30" or "overlap portions 30 ($30_A$ and $30_B$), or also individually called "overlap portions $30_A$ and $30_B$ hereinafter.

That is, the DC terminal $22_A$ of each semiconductor module 2, which is closer, i.e. nearer, to the overlap portions 30 than the DC terminal $22_B$ is to the overlap portions 30 in the Y direction, serves as a near terminal $22_A$, and the DC terminal $22_B$ of each semiconductor module 2, which is farther from the overlap portions 30 than the near terminal $22_A$ is from the overlap portions 30 in the Y direction, serves as a far terminal $22_B$.

Figure 4:
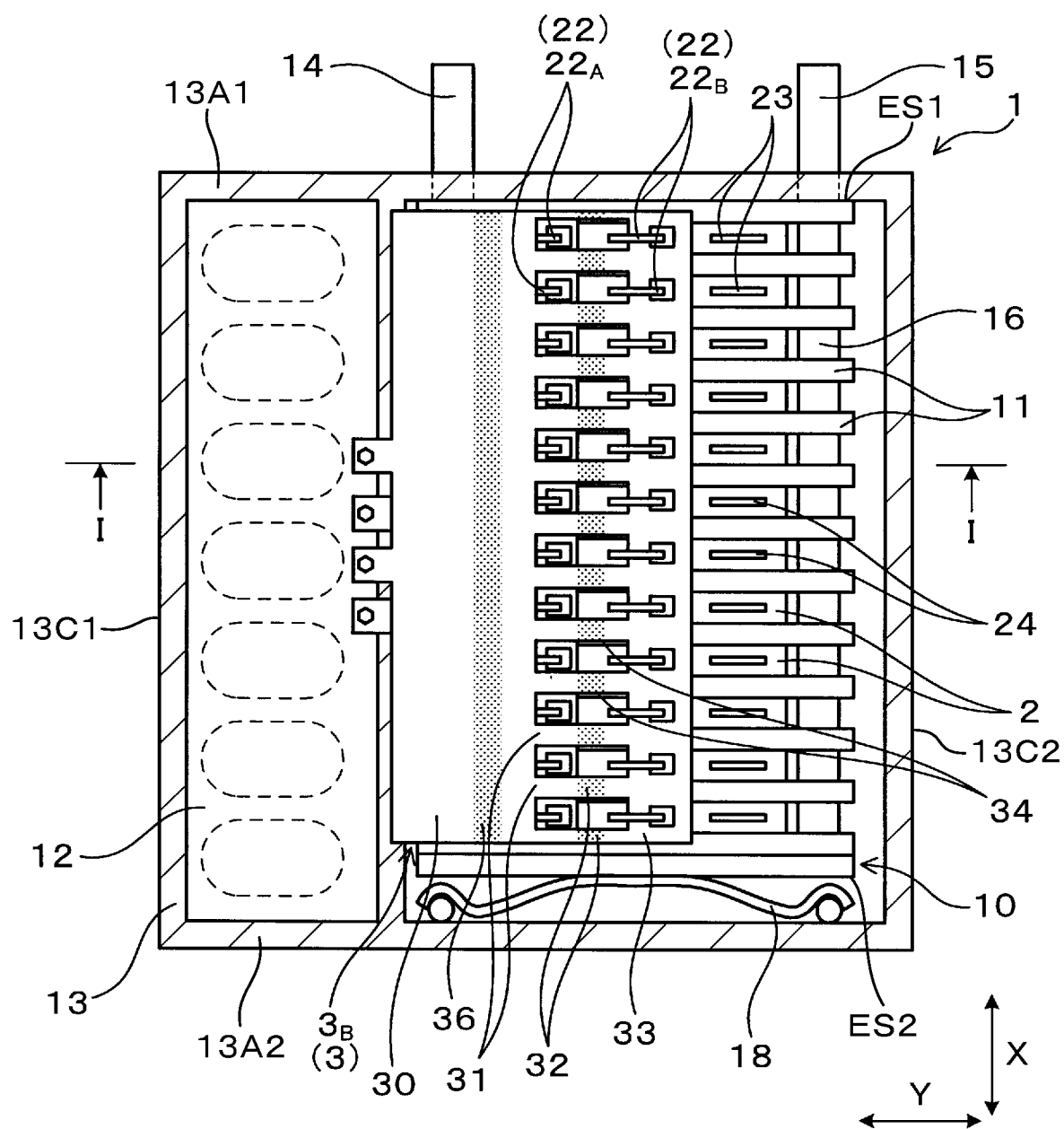
FIG. 4 is a cross-sectional view taken along line IV-IV in FIG. 1.
Figure 5:
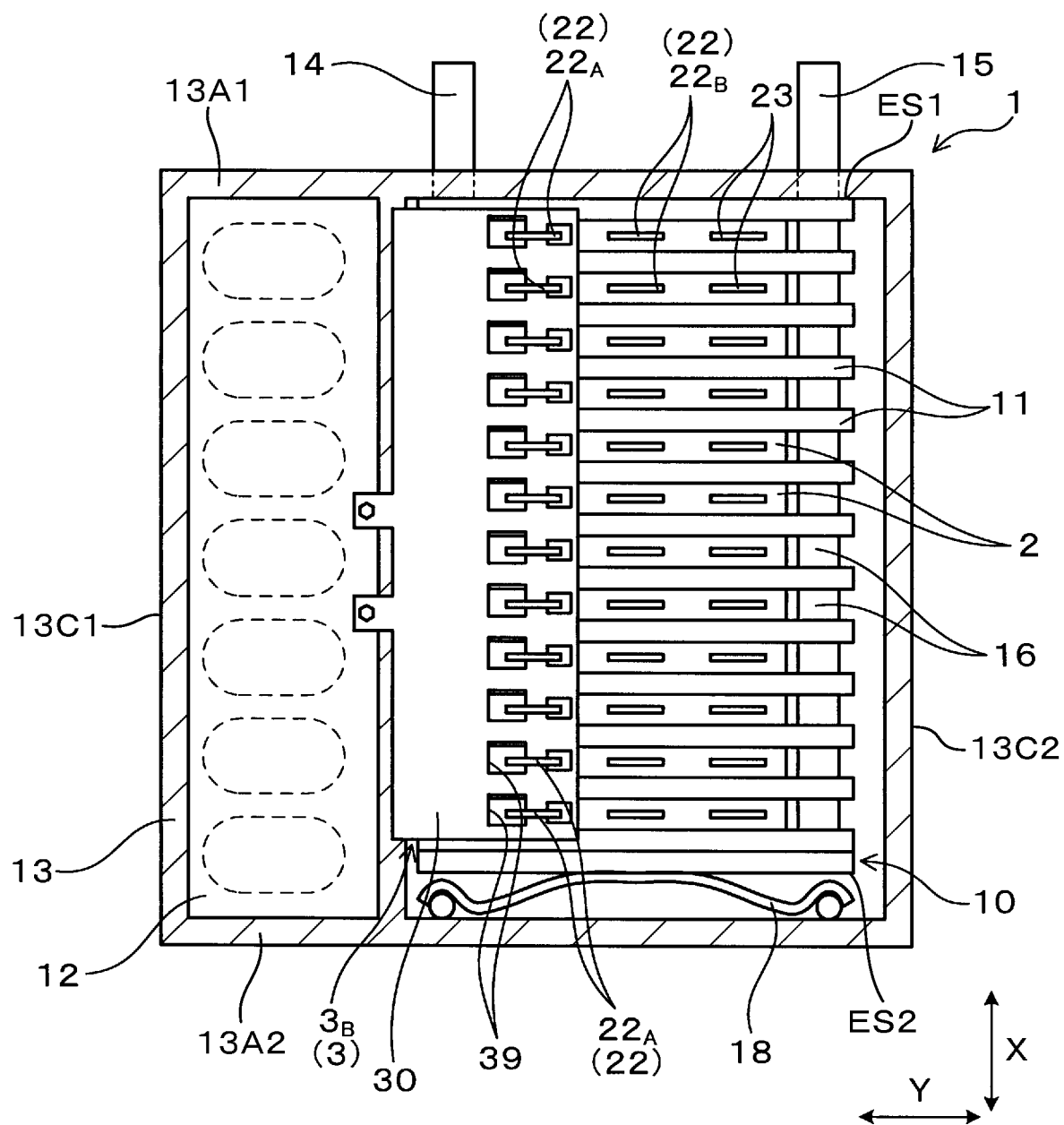
FIG. 5 is a diagram corresponding to FIG. 4 from which a far busbar has been removed.

The DC busbars $3_A$ and $3_B$ are arranged with respect to the converter component 21, i.e. the major side 21b1 of the case 21a, such that (1) The overlap portion $30_A$ of the DC busbar $3_A$ is closer, i.e. nearer, to the converter component 21 than the overlap portion $30_B$ of the DC busbar $3_B$ is in the Z direction; the DC busbar $3_A$ serves as a near busbar $3_A$ (2) The overlap portion $30_B$ of the DC busbar $3_B$ is farther from the converter component 21 than the overlap portion $30_A$ of the DC busbar $3_A$ is in the Z direction; the DC busbar $3_B$ serves as a far busbar $3_B$ The second end of the near busbar $3_A$ is connected to the near terminals $22_A$ of the respective semiconductor modules 2, and the second end of the far busbar $3_B$ is connected to the far terminals $22_B$ of the respective semiconductor modules 2 (see, for example, FIG. 4).

Specifically, the far busbar $3_B$ includes the overlapping portion 30, an inclined portion 36, a flat plate portion 31, an inclined portion 32, and a joint portion 33. The flat plate portion 31 and the inclined portion 36 serve as, for example, a cover portion.

As described above, the overlap portion $30_B$ of the far busbar $3_B$ is a part of the first end of the far busbar $3_B$, and the first end of the far busbar $3_B$ is connected to the smoothing capacitor 12.

The inclined portion 36 has opposing first and second ends in its length direction, i.e. in the Y direction. The first end of the inclined portion 36 is continuously joined to the overlap portion $30_B$, so that the inclined portion 36 continuously extends from the overlap portion $30_B$ such that the inclined portion 36 is inclined to be far from, i.e. separated from, the main converter portion 21 as the inclined portion 36 approaches the near terminals $22_A$ of the respective semiconductor modules 2.

The flat plate portion 31 has a predetermined thickness, and opposing first and second ends in its length direction, i.e. in the Y direction. The first end of the flat plate portion 31 is continuously joined to the second end of the inclined portion 36, so that the flat plate portion 31 continuously extends from the inclined portion 36 in substantially parallel to the Y direction while the thickness direction of the flat plate portion 31 agrees with the Z direction. The flat plate portion 31 extends to be located to face the near terminals $22_A$ of the respective semiconductor modules 2 to thereby cover the near terminals $22_A$ of the respective semiconductor modules 2 from one side of the Z direction closer to the sidewall 13B1 than the other side of the Z direction closer to the sidewall 13B2.

That is, the far busbar $3_B$ is folded by the inclined portion 36 between the overlap portion $30_B$ and the flat plate portion 31.

The inclined portion 32 has opposing first and second ends in its length direction, i.e. in the Y direction. The first end of the inclined portion 32 is continuously joined to the second end of the flat plate portion 31, so that the inclined portion 32 continuously extends from the flat plate portion 31 such that the inclined portion 32 is inclined to be close to the main converter portion 21 as the inclined portion 32 approaches the far terminals $22_B$ of the respective semiconductor modules 2.

The joint portion 33, which constitutes the second end of the far busbar $3_B$, has opposing first and second ends in its length direction, i.e. in the Y direction. The first end of the joint portion 33 is continuously joined to the second end of the inclined portion 32, so that the joint portion 33 continuously extends from the inclined portion 32 to be located to face the far terminals $22_B$ of the respective semiconductor modules 2. The joint portion 33 is connected to, i.e. joined to, the far terminals $22_B$ of the respective semiconductor modules 2.

That is, the far busbar $3_B$ is folded by the inclined portion 32 between the flat plate portion 31 and the joint portion 33.

Additionally, each semiconductor module 2 includes control terminals 24 each having a first end connected to the corresponding one of the semiconductor elements 20 installed in the corresponding semiconductor module 2. Each of the control terminals 24 has a second end, which is opposite to the first end, is for example configured to protrude from the major side 21b2 of the corresponding case 21a to extend by a predetermined length in the Z direction toward the sidewall 13B2 of the housing 13. The second ends of the control terminals 24 of each semiconductor module 2 are connected to the control circuit board 19. That is, the control terminals of the respective semiconductor elements 20 installed in the stack assembly 10 are connected to the control circuit board 19.

For example, as illustrated in FIG. 8, the number of the semiconductor modules 2 is set to 12, and each of the semiconductor modules 2 is comprised of (1) A first semiconductor element 20 comprised of an upper-arm semiconductor switch, such as an IGBT, and a flyback diode connected in antiparallel thereto (2) A second semiconductor element 20 comprised of a lower-arm semiconductor switch, such as an IGBT, and a flyback diode connected in antiparallel thereto; the first and second semiconductor elements 20 are connected in series to each other The twelve semiconductor modules 2 include a first group of semiconductor modules 2 for a first three-phase AC motor-generator (MG) 82A, and a second group of semiconductor modules 2 for a second three-phase AC motor-generator 82B. That is, the AC terminals 23 of the respective semiconductor modules 2 of the first group are connected to the first three-phase AC motor-generator 82A via AC busbars (see "ABB" in FIG. 8). Similarly, the AC terminals 23 of the respective semiconductor modules 2 of the second group are connected to the second three-phase AC motor-generator 82B via AC busbars (see "ABB" in FIG. 8).

That is, the control circuit board 19 is configured to control (1) On-off switching operations of each semiconductor switch included in the first group of the semiconductor modules 2 to thereby enable the power converter 1 to convert DC power supplied from the DC power source 8 into AC power, and supplies the AC power to the first three-phase AC motor-generator $82_A$ (2) On-off switching operations of each semiconductor switch included in the second group of the semiconductor modules 2 to thereby enable the power converter 1 to convert the DC power supplied from the DC power source 8 into AC power, and supplies the AC power to the second three-phase AC motor-generator $82_B$ Supplying the AC power to each of the first and second three-phase AC motor-generators 82A and 82B causes the vehicle to travel As described above, as illustrated in FIG. 6, the stack assembly 10 is configured such that the semiconductor modules 2 and the cooling pipes 11 are alternately stacked in the X direction, i.e. the stack direction, to have a stack structure.

That is, the power converter 1 includes cooling mechanism CM, which is comprised of the cooling pipes 11 and joint pipes 16, for cooling the semiconductor modules 2.

Specifically, each of the cooling pipes 11 has a substantially rectangular plate-like shape, and has a longitudinal length in the Y direction longer than the longitudinal length of each semiconductor module 2 in the Y direction. Referring to FIG. 6, the semiconductor modules 2 and the cooling pips 11 are alternately arranged in the X direction to constitute the stack assembly 10 such that two cooling pipes 11a and 11b are located at both ends of the stack assembly 10 in the X direction.

Each of the cooling pipes 11 has opposing first and second ends in its longitudinal direction, i.e. the Y direction. The joint pipes 16 include first joint pipes 16a communicably connecting the first ends of the cooling pipes 11, and second joint pipes 16b communicably connecting the second ends of the cooling pipes 11. The cooling mechanism CM is arranged such that the second ends of the cooling pipes 11, which are joined by the joint pipes 16b, are located to be closer to the capacitor 12 than the first ends of the cooling pipes 11 are.

Referring to FIG. 6, the power converter 1 includes an introduction pipe 14 and an exhaust pipe 15. The cooling pipe 11a is located to be closer to the sidewall 13A1 of the housing 13 than the cooling pipe 11b is. The cooling pipe 11a has opposing first and second ends; the second end of the cooling pipe 11a is located to be closer to the capacitor 12 than the first end of the cooling pipe 11a is. In particular, the cooling pipe 11a is in direct contact with the sidewall 13A1 of the housing 13.

The introduction pipe 14 airtightly penetrates through the sidewall 13A1 of the housing 13 to be communicably connected to the second end of the cooling pipe 11a of the cooling mechanism CM. The exhaust pipe 15 is airtightly penetrated through the sidewall 13A1 of the housing 13 to be communicably connected to the first end of the cooling pipe 11a of the cooling mechanism CM. When a predetermined refrigerant, i.e. a coolant, 17 is introduced into the introduction pipe 14, the refrigerant 17 flows into all the cooling pipes 11 from their second ends via the second joint pipes 16b, and reaches the first ends of all the cooling pipes 11. Thereafter, the refrigerant 17 flows through the first joint pipes 11a to be exhausted from the exhaust pipe 15. That is, introduction of the refrigerant 17 into the cooling pipes 11 and exhaust of the refrigerant 17 from the cooling pipes 11 are repeatedly carried out, resulting in cooling of the semiconductor modules 2.

The power converter 1 includes a pressing member 18 located between the cooling pipe 11b of the cooling mechanism CM and the inner surface of the sidewall 13A2 of the housing 13. For example, a leaf spring is used as the pressing member 18. Specifically, the pressing member 18 elastically presses the cooling pipe 11b to the opposing sidewall 13A1 of the housing 13 in the X direction, i.e. the stack direction of the semiconductor modules 2 to thereby fixedly fasten the stack assembly 10 to the housing 13 while ensuring contact pressure between each semiconductor module 2 and a corresponding pair of cooling pipes 11 adjacent to the semiconductor module 2.

Next, the following describes in detail each of the far busbar $3_B$ and the near busbar $3_A$ with reference to, for example, FIGS. 2 to 5 and 7.

As described above, the far busbar $3_B$ is comprised of the overlapping portion 30, the inclined portion 36, the flat plate portion 31, the inclined portion 32, and the joint portion 33.

The first end of the far busbar $3_B$ and the first end of the near busbar $3_A$ are overlapped with each other in the Z direction through the insulation member 4; the far and near busbars $3_B$ and $3_A$ constructed set forth above constitute the busbar assembly 3BA. For example, the insulation member 4 of the first embodiment is made of insulation paper. The insulation member 4 is thinner in thickness than each of the DC busbars 3.

Figure 3:
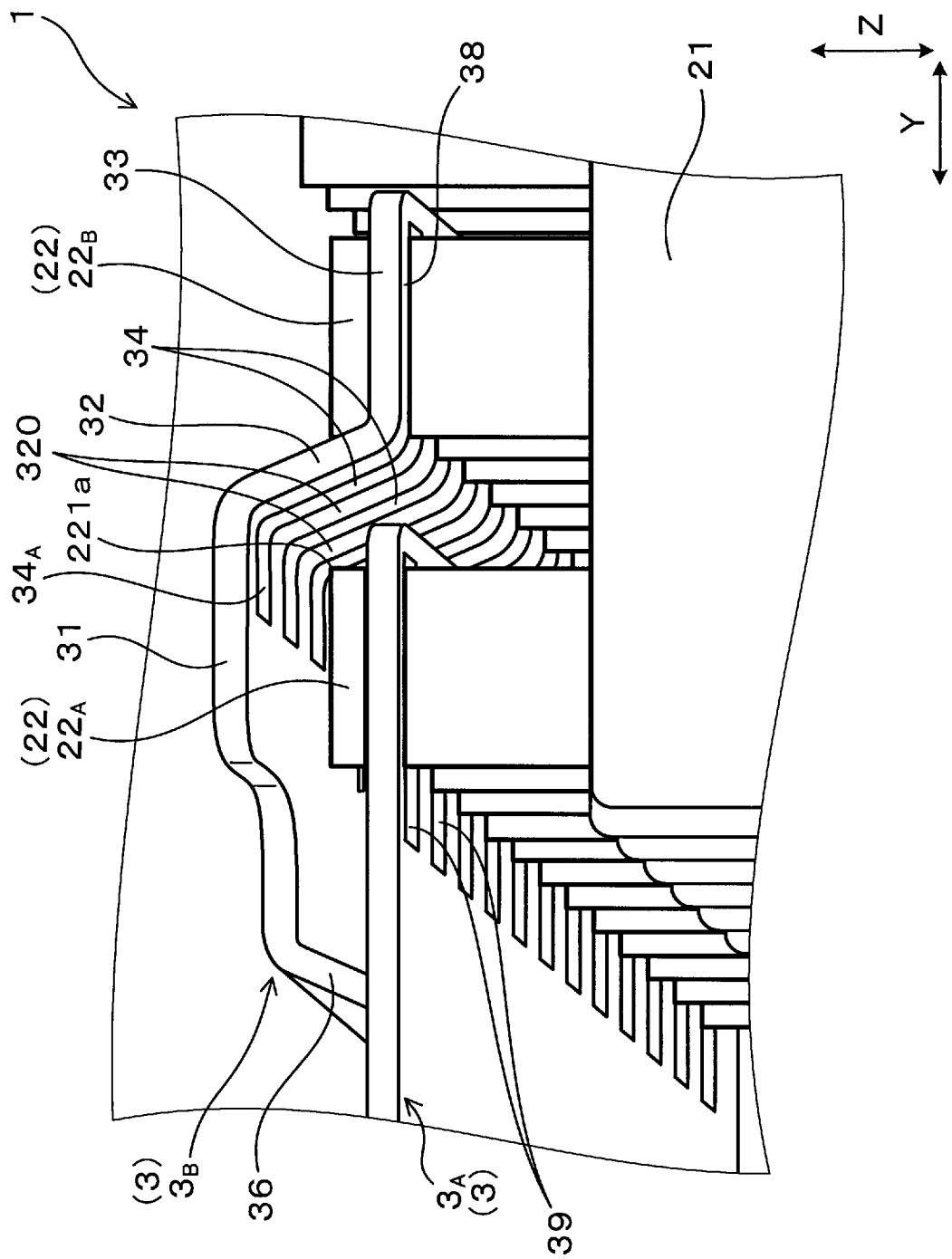
FIG. 3 is an enlarged perspective view of principal components of the power converter illustrated in FIG. 1.
Figure 7:
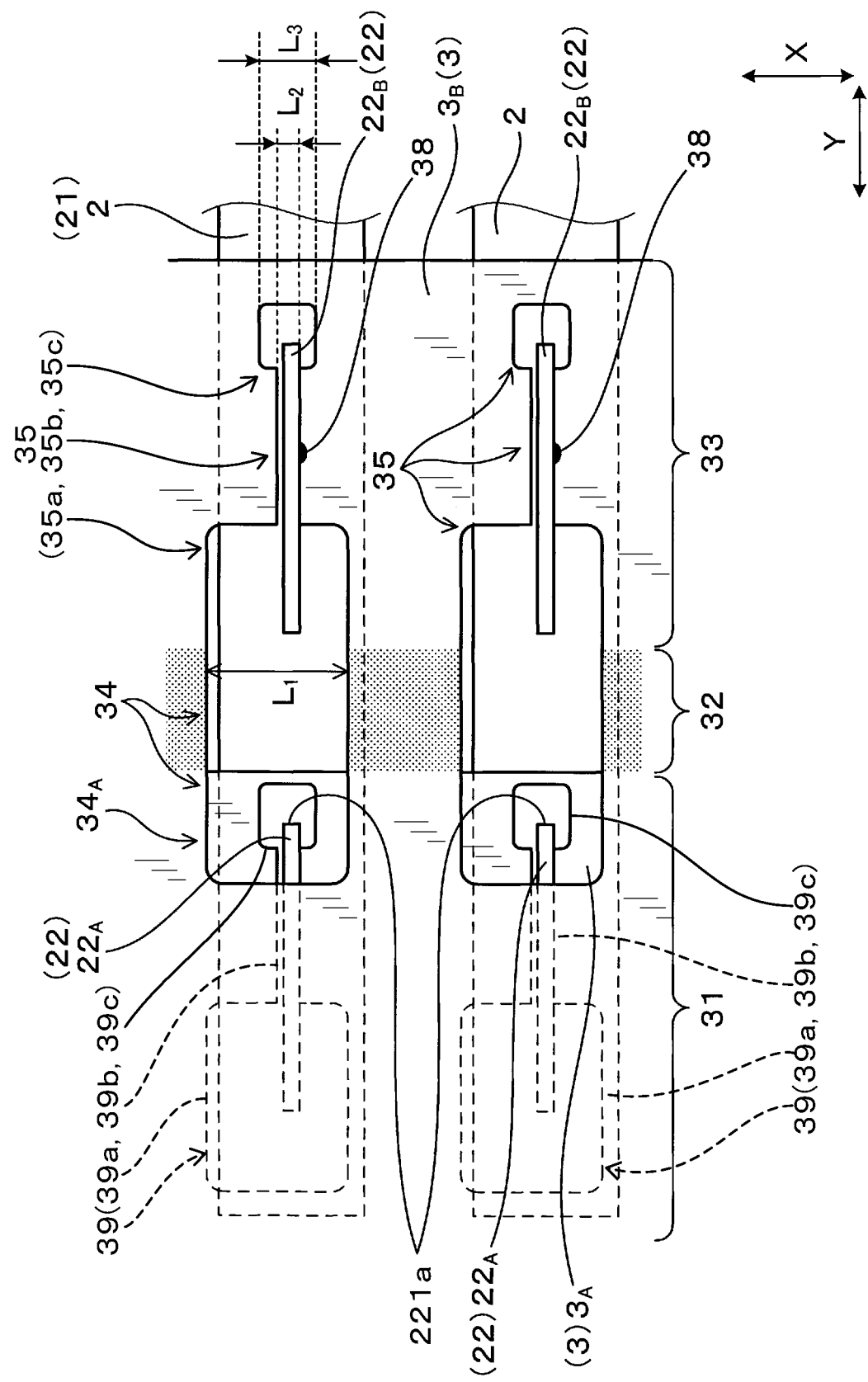
FIG. 7 is an enlarged plan view of principal components of the power converter illustrated in FIG. 1.

In particular, as illustrated in FIG. 3, FIG. 4, and FIG. 7, the far busbar $3_B$ is comprised of slits 34 formed therethrough in the Z direction; each of the slits 34 has, for example, a rectangular shape with a predetermined minimum width $L_1$, i.e. a minimum length $L_1$, in the X direction. The slits 34 are arranged in the X direction with predetermined intervals therebetween, so that the slits 34 are adjacent to the respective near terminals $22_A$ in the Y direction.

Note that one of the corners 221 of the near terminal $22_A$, which is located to be closer to the far terminal $22_B$ than the other thereto, will be referred to as a closer corner 221a.

Each of the slits 34 extends from the second end of the flat plate portion 31 to the second end of the inclined portion 32 in the Y direction, so that a part $34_A$ of each slit 34 located at the second end of the flat plate portion 31 is located to face the corresponding one of the far terminals $22_B$ in the Z direction (see FIGS. 2 and 7). This enables, as seen from each side of the Z direction, one of the corners 221 of each near terminal $22_A$, which is located closer to the far terminal $22_B$ in the Y direction than the other thereto, to be visibly recognized through the part $34_A$ of the corresponding slit 34.

That is, the parts $34_A$ of the respective slits 34 located at the second end of the flat plate portion 31 are aligned with the closer corners 221a of the respective near terminal $22_A$.

The far busbar $3_B$ is also comprised of through holes 35 formed through the joint portion 33 in the Z direction and communicably joined to the respective slits 34.

Each of the through holes 35 is comprised of a first portion 35a having a rectangular shape in a cross section along the X-Y plane; the longitudinal direction of the rectangular-shaped first portion 35a is along the Y direction (see FIG. 7). The first portion 35a has, for example, the same width $L_1$ and is formed through the first end of the joint portion 33 to be communicably joined to the corresponding slit 34.

Each of the through holes 35 is also comprised of a second portion 35b having a rectangular thin shape in a cross section along the X-Y plane; the longitudinal direction of the rectangular-thin shaped second portion 35b is along the Y direction (see FIG. 7). The second portion 35b continuously extends from the first portion 35a toward the second end of the joint portion 33. The second portion 35b has a width $L_2$, i.e. a length $L_2$, in the X direction, which is shorter than the width $L_1$ of the first portion 35a.

Each of the through holes 35 is further comprised of a third portion 35c having a rectangular shape in a cross section along the X-Y plane; the longitudinal direction of the rectangular-shaped third portion 35c is along the Y direction (see FIG. 7). The third portion 35c is formed through the second end of the joint portion 33 to continuously extend from the second portion 35b. The third portion 35c has a width L3, i.e. a length L3 in the X direction, which is shorter than the width $L_1$ of the first portion 35a and longer than the width $L_2$ of the second portion 35b.

That is, the far terminals $22_B$ of the respective semiconductor modules 2 are filled in, i.e. passed in, the through holes 35 of the joint portion 33. Because the through holes 35 located at the joint portion 33 are aligned with the respective far terminal $22_B$, it is possible to easily insert the far terminals $22_B$ of the respective semiconductor modules 2 into the through holes 35 of the joint portion 33. In particular, each of the far terminals $22_B$ filled in the corresponding one of the through holes 35 extends from the first portion 35a to the third portion 35c. A part of each far terminal $22_B$ passed in the second portion 35b of the corresponding hole 35 is fastened to, for example, welded to an inner wall of the second portion 35b of the joint portion 33. Reference numeral 38 represents a welded portion between the far terminal $22_B$ and the joint portion 33.

Additionally, the near busbar $3_A$ is comprised of through holes 39 formed therethrough in the Z direction.

Each of the through holes 39 is comprised of a first portion 39a having a rectangular shape in a cross section along the X-Y plane; the longitudinal direction of the rectangular-shaped first portion 39a is along the Y direction (see FIG. 7). The first portion 39a has a width that is set to be, for example, the same as the width $L_1$ of the first portion 35a, and the first portion 39a is formed through the first end of the near busbar $3_A$.

Each of the through holes 39 is also comprised of a second portion 39b having a rectangular thin shape in a cross section along the X-Y plane; the longitudinal direction of the rectangular-thin shaped second portion 39b is along the Y direction (see FIG. 7). The second portion 39b continuously extends from the first portion 39a toward the second end of the near busbar $3_A$. The second portion 39b has a width, i.e. a length in the X direction, which is shorter than the width of the first portion 39a.

Each of the through holes 39 is further comprised of a third portion 39c having a rectangular shape in a cross section along the X-Y plane; the longitudinal direction of the rectangular-shaped third portion 35c is along the Y direction (see FIG. 7). The third portion 39c is formed through the second end of the near busbar $3_A$ to continuously extend from the second portion 39b. The third portion 39c has a width, i.e. a length in the X direction, which is shorter than the width of the first portion 39a and longer than the width of the second portion 39b.

That is, the near terminals $22_A$ of the respective semiconductor modules 2 are filled in, i.e. passed in, the through holes 39 of the near busbar $3_A$. Because the through holes 39 located at the second end of the near busbar $3_A$ are aligned with the respective near terminal $22_A$, it is possible to easily insert the near terminals $22_A$ of the respective semiconductor modules 2 into the respective through holes 39 of the near busbar $3_A$. In particular, each of the near terminals $22_A$ filled in the corresponding one of the through holes 39 extends from the first portion 39a to the third portion 39c. A part of each far terminal $22_A$ passed in the second portion 39b of the corresponding through hole 39 is fastened to, for example, welded to an inner wall of the second portion 39b of the corresponding through hole 39. Reference numeral 38 represents a welded portion between the far terminal $22_B$ and the joint portion 33.

Additionally, as illustrated in FIG. 2, the insulation member 4 has opposing first and second ends in the Y direction; the first end is closer to the near terminal $30_B$ than the second end is. The first end of the insulation member 4 is configured to extend from the overlap portions 30 ($30_A$ and $30_B$) toward the near terminal $22_A$. This increases a creepage distance between the near busbar $3_A$ and the far busbar $3_B$, resulting in the electrical isolation between the DC busbars $3_A$ and $3_B$ being higher.

The following describes how the power converter 1 of the first embodiment works and obtains technical benefits.

As illustrated in FIG. 2, the power converter 1 of the first embodiment is configured such that the near busbar $3_A$ is connected to the near terminals $22_A$ of the respective semiconductor modules 2, and the far busbar $3_B$ is connected to the far terminals $22_B$ of the respective semiconductor modules 2 without the formation of through holes in the near busbar $3_A$ for insertion of the near terminals This configuration eliminates a need to form, in at least the near busbar $3_A$, through holes through which the near terminals $22_A$ of the respective semiconductor modules 2 are inserted. This therefore makes it possible to increase the area of each of the pair the DC busbars $3_A$ and $3_B$ facing the other thereof, resulting in a lower parasitic inductance in the DC busbars $3_A$ and $3_B$.

Specifically, FIG. 12 schematically illustrates a power converter 1X according to a comparative example of the first embodiment. Like the first embodiment, an insulation member 104 is interposed between an overlap portion 130 of a first end of a near busbar $103_A$ and an overlap portion 130 of a first end of a far busbar $103_B$. A second end of the far busbar $103_B$ is joined to a near DC terminal $122_A$ of each semiconductor module 102. In addition, the near busbar $103_A$ includes through holes 109 formed through its middle portion between the first and second ends for the respective near DC terminals $122_A$ of the respective semiconductor modules 102. This results in (1) Far DC terminals $122_B$ of the respective semiconductor modules 102 being joined to the second end of the near busbar $103_A$ (2) The near DC terminals $122_A$ of the respective semiconductor modules 102 being passed through the respective through holes 109 of the middle portion of the near busbar $103_A$ For the comparative example, the size of each of the through holes 109 of the near busbar $103_A$ need be large enough to be electrically isolated from the near DC terminal $122_A$ filled in the corresponding one of the through holes 109.

The existence of the through holes 109 formed through the near busbar $103_A$ may result in the area of the near busbar $103_A$, which faces the corresponding area of the far busbar $103_B$, becoming smaller, resulting in a parasitic inductance in the near busbar $103_A$ and far busbar $103_B$ due to, for example, a decrease in a mutual inductance between the near busbar $103_A$ and far busbar $103_B$.

In contrast, as described above, the power converter 1 of the first embodiment is configured such that the near busbar $3_A$ is simply connected to the near terminals $22_A$ of the respective semiconductor modules 2, and the far busbar $3_B$ is configured to bypass or circumvent the near terminals $22_A$ of the respective semiconductor modules 2, for example, extend beyond the near terminals $22_A$, so as to be connected to the far terminals $22_B$ of the respective semiconductor modules 2. This configuration prevents formation of through holes in the near busbar $3_A$ for insertion of the near terminals $22_A$. This therefore makes it possible to increase the area of each of the pair the DC busbars $3_A$ and $3_B$ facing the other thereof, resulting in a lower parasitic inductance in the DC busbars $3_A$ and $3_B$.

As described above, the comparative example illustrated in FIGS. 12 and 13 is configured such that the near busbar $103_A$ includes the through holes 109 formed through its middle portion between the first and second ends for the respective near DC terminals $122_A$ of the respective semiconductor modules 102. This needs an increase in distance between adjacent near terminals $122_A$ of adjacent semiconductor modules 102 in the stack direction in order to prevent two adjacent through holes 109 for the respective adjacent near terminals $122_A$ from being joined to each other in the stack direction. This unfortunately may cause the power converter 1X of the comparative example to be likely to have a larger size.

In contrast, as described above, the above configuration of the power converter 1, which prevents formation of through holes in the near busbar $3_A$ for insertion of the near terminals $22_A$, enables the distance between each pair of adjacent near terminals $22_A$ of adjacent semiconductor modules 2 in the stack direction to become shorter, resulting in the size of the power converter 1 being smaller.

In addition, as illustrated in, for example, FIG. 2, the far busbar $3_B$ is configured such that (1) The flat plate portion 31 extends beyond the near terminals $22_A$ of the respective semiconductor modules 2

(2) The inclined portion 32 extends, from the second end, i.e. extending end, of the flat plate portion 31, obliquely outward toward the main converter portions 21 of the respective semiconductor modules 2

This configuration enables the joint portion 33, which is continuously joined to the second end of the inclined portion 32, to be closer to the main converter portions 21, resulting in the length of each far terminal $22_B$ being shorter. This enables a parasitic inductance in at least one of the far terminals $22_B$ to be smaller, thus preventing the occurrence of a large surge due to the parasitic inductance each time when at least one of the semiconductor switches 20 is turned on or off.

As illustrated in FIGS. 3 and 7, the inclined portion 32 of the far busbar $3_B$ is comprised of the slits 34 formed therethrough in the Z direction; the slits 34 are aligned with and adjacent to the respective far terminal $22_A$. This configuration enables the rigidity of the far busbar $3_B$ to be smaller, making it possible for the far busbar $3_B$ to bend when external vibrations are applied to the power converter 1. Accordingly, this configuration prevents high stress from being applied to the welded portions 38 between the far busbar $3_B$ and the respective far terminals $22_B$.

Furthermore, the slits 34 formed through the inclined portion 32 of the far busbar $3_B$ results in an increase in the shortest distance of the inclined portion 32 relative to each near terminal $22_A$. That is, each slit 34 formed through the inclined portion 32 of the far busbar $3_B$ enables a minimum distance from a portion 320 between the corresponding slit 34 and an adjacent slit 34 to the near terminal $22_A$ that faces the corresponding slit 34 in the X direction to become the shortest distance of the inclined portion 32 relative to the corresponding near terminal $22_A$. This enables the shortest distance of the inclined portion 32 relative to each near terminal $22_A$ to be longer, resulting in electrical isolation between the inclined portion 32 and each near terminal $22_A$ to be more improved.

As illustrated in FIG. 3 and FIG. 7, the slits 34 of the first embodiment extend from the inclined portion 32 to the flat plate portion 31. As seen from one side of the Z direction, the power converter 1 is configured to enable the corner 221a of each near terminal $22_A$ located closer to the corresponding far terminal $22_B$ adjacent to the corresponding near terminal $22_A$ in the Y direction to be visible through the part $34_A$ of the corresponding slit 34 formed in the flat plate portion 31.

This enables an increase in the shortest distance from the corner 221a of each near terminal $22_A$ to the far busbar $3_B$. Because the corner 221a of each near terminal $22_A$ is likely to be high, an increase in the shortest distance from the corner portion 221a to the far busbar $3_B$ enables an electrical isolation to be highly established between the corner 221a and the far busbar $3_B$.

Furthermore, as illustrated in FIG. 7, the joint portion 33 of the far busbar $3_B$ is comprised of the through holes 35 formed through the joint portion 33 in the Z direction and communicably joined to the respective slits 34.

This configuration enables a further reduction in the rigidity of the far busbar $3_B$ compared to a configuration in which the terminal insertion holes 35 and the slits 34 are formed separately from each other. This configuration enables the rigidity of the far busbar $3_B$ to be smaller, making it possible for the far busbar $3_B$ to bend when external vibrations are applied to the power converter 1. Accordingly, this configuration prevents high stress from being applied to the welded portions 38 between the far busbar $3_B$ and the respective far terminals $22_B$.

As illustrated in FIG. 7, the minimum width $L_1$ of each the slit 34 in the X direction is larger than the minimum width $L_2$ of each through hole 35 in the X direction.

This enables an enough increase in the minimum width $L_1$ of each slit 34 in the X direction. This configuration enables the rigidity of the far busbar $3_B$ to be smaller, making it possible for the far busbar $3_B$ to bend when external vibrations are applied to the power converter 1. Accordingly, this configuration prevents high stress from being applied to the welded portions 38 between the far busbar $3_B$ and the respective far terminals $22_B$.

FIG. 2 schematically illustrates that the insulation member 4 has a thickness $L_4$ in the Z direction that is smaller than the thickness of each DC busbar 3.

This configuration enables the DC busbars $3_A$ and $3_B$ to be closer to each other, making it possible to further reduce a parasitic inductance between the DC busbars $3_A$ and $3_B$.

The first end of the insulation member 4, which is closer to the near terminal $30_B$ than the second end is, is configured to extend from the overlap portions 30 ($30_A$ and $30_B$) toward the near terminal $22_A$. This increases a creepage distance between the near busbar $3_A$ and the far busbar $3_B$ to insulate the DC busbars $3_A$ and $3_B$ from each other. This increases a creepage distance between the near busbar $3_A$ and the far busbar $3_B$, resulting in the electrical isolation between the DC busbars $3_A$ and $3_B$ being higher.

As described above, the first embodiment provides the power converter 1 having a smaller size with a DC terminal and/or a DC busbar having a smaller parasitic inductance.

Second Embodiment

Figure 9:
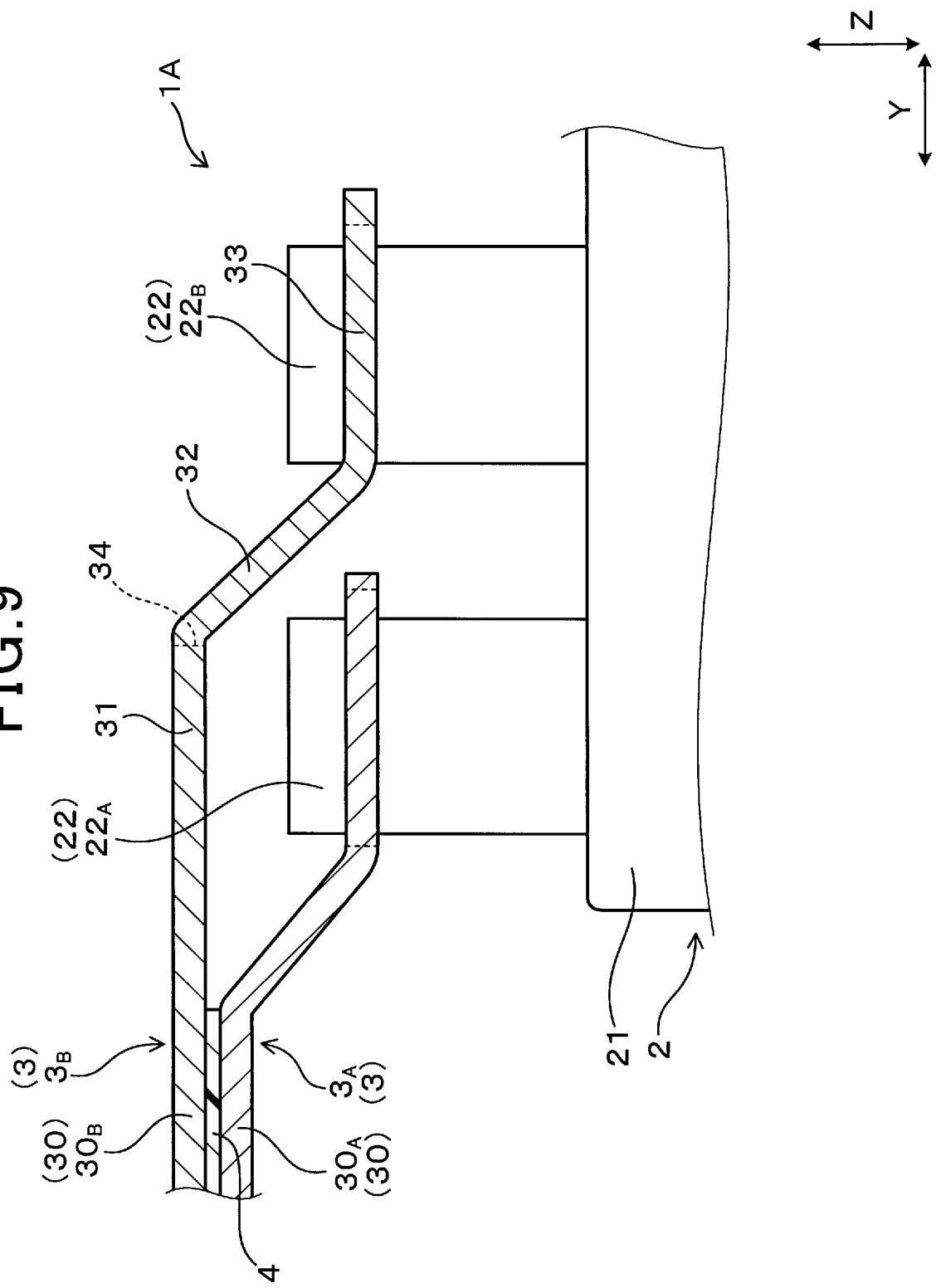
FIG. 9 is an enlarged cross-sectional view of principal components of a power converter according to the second embodiment of the present disclosure.

The following describes the second embodiment of the present disclosure with reference to FIG. 9. The configuration and functions of a power converter 1A according to the second embodiment are mainly different from those of the power converter 1 according to the first embodiment by the following points. The following therefore mainly describes the different points.

As illustrated in FIG. 9, the power converter 1A according to the second embodiment is configured such that the shape of each of the DC busbars 3 is changed.

Specifically, the position of the overlap portion $30_B$ of the far busbar $3_B$ is aligned with the position of the flat plate portion 31 in the Z direction. That is, the far busbar $3_B$ is unfolded between the overlap portion $30_B$ and the flat plate portion 31.

This configuration of the power converter 1A reduces the number of times the far busbar $3_B$ is folded as compared to the power converter 1 of the first embodiment. Thus, the far busbar $3_B$ can be more easily manufactured.

Third Embodiment

Figure 10:
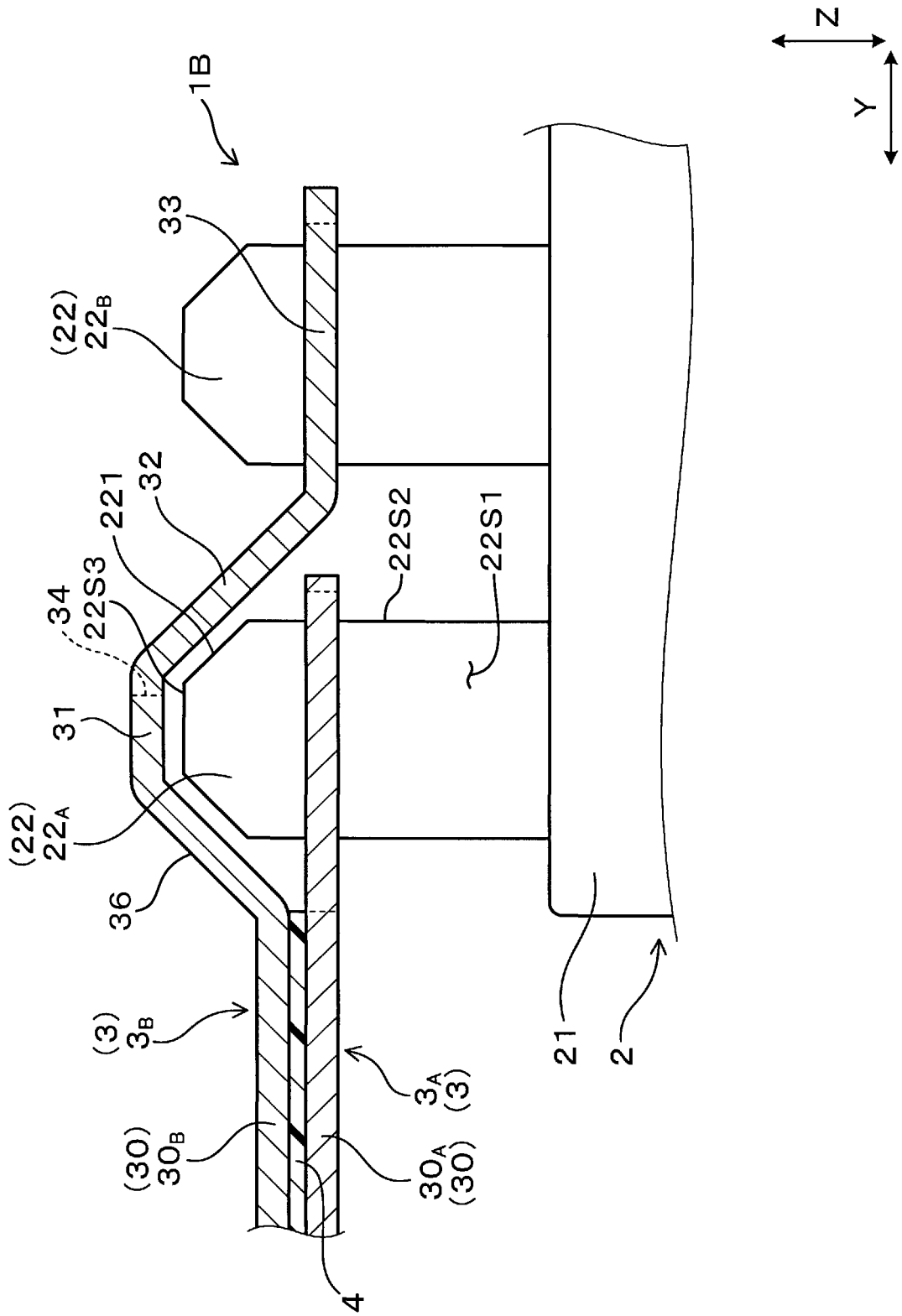
FIG. 10 is an enlarged cross-sectional view of principal components of a power converter according to the third embodiment of the present disclosure.

The following describes the third embodiment of the present disclosure with reference to FIG. 10. The configuration and functions of a power converter 1B according to the third embodiment are mainly different from those of the power converter 1 according to the first embodiment by the following points. The following therefore mainly describes the different points.

As illustrated in FIG. 10, the power converter 1B according to the third embodiment is configured such that the shape of each of the DC terminals 22 ($22_A$ and $22_B$) is changed.

Specifically, the corners 221 of each DC terminal 22 ($22_A$ and $22_B$) are tapered from the end side $22s3$ toward the respective minor sides $22s2$. The shape of the far busbar $3_B$ can be configured such that (1) The length of the flat plate portion 31 is shorter than the length of the flat plate portion 31 of the first embodiment (2) The inclined surfaces 36 and 32, which face the respective corners 221 of each DC terminal 22 ($22_A$ and $22_B$), are tapered toward the flat plate portion 31 in conformity with the respective tapered corners 221

This enables field concentration at each corner 221 to be suppressed, making it possible to more highly establish electrical isolation between each corner 221 and the far busbar $3_B$.

Fourth Embodiment

Figure 11:
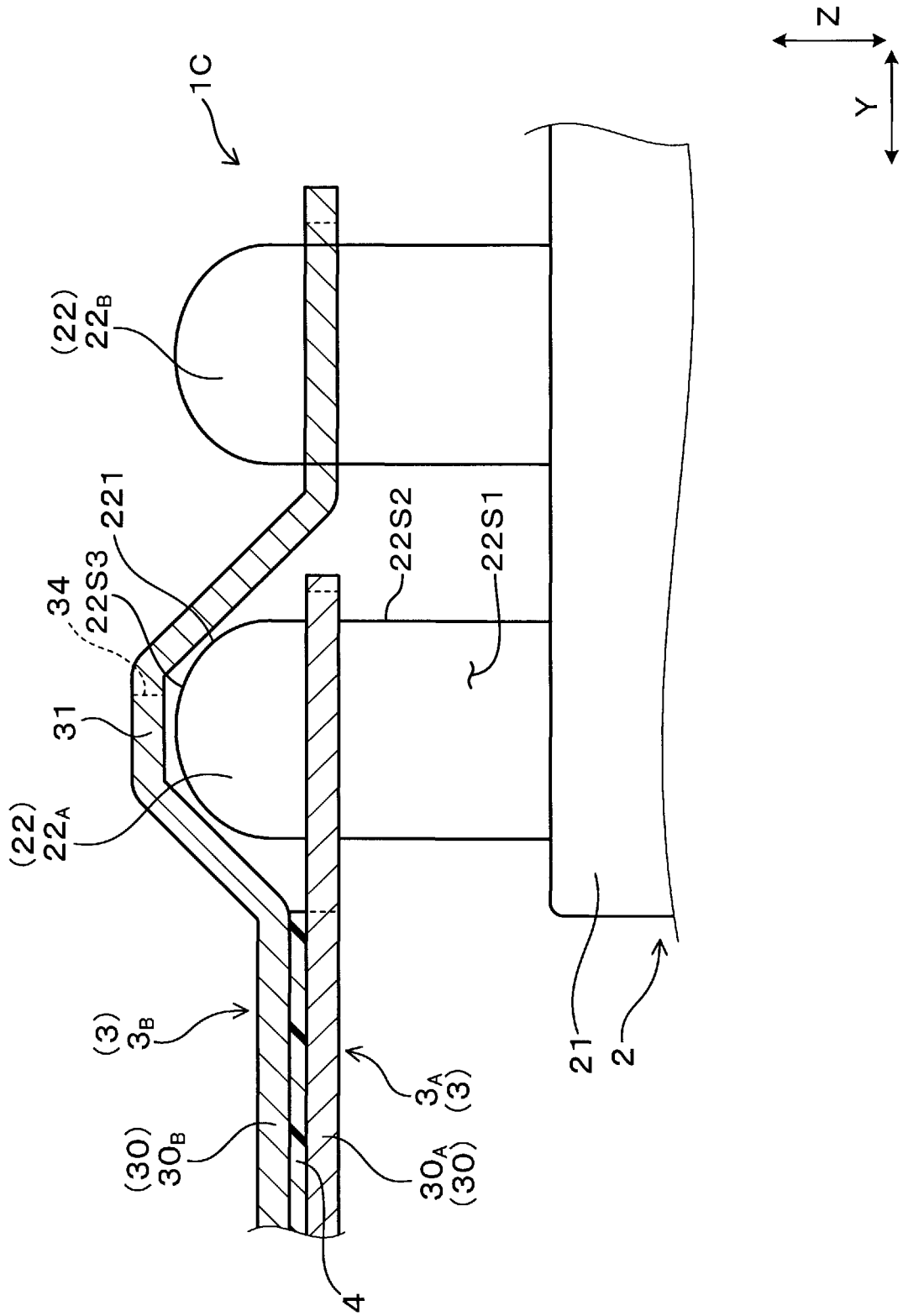
FIG. 11 is an enlarged cross-sectional view of principal components of a power converter according to the fourth embodiment of the present disclosure.

The following describes the fourth embodiment of the present disclosure with reference to FIG. 11. The configuration and functions of a power converter 1C according to the fourth embodiment are mainly different from those of the power converter 1 according to the first embodiment by the following points. The following therefore mainly describes the different points.

As illustrated in FIG. 11, the power converter 1C according to the fourth embodiment is configured such that the corners 221 of each DC terminal 22 (22$_A$ and 22$_B$) are rounded so as to be curvedly tapered from the end side 22s3 toward the respective minor sides 22s2. The shape of the far busbar 3$_B$ can be configured such that (1) The length of the flat plate portion 31 is shorter than the length of the flat plate portion 31 of the first embodiment (2) The inclined surfaces 36 and 32, which face the respective corners 221 of each DC terminal 22 (22$_A$ and 22$_B$), are tapered toward the flat plate portion 31

This enables field concentration at each corner 221 to be suppressed, making it possible to more highly establish electrical isolation between each corner 221 and the far busbar 3$_B$.

While illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A power converter comprising:
   a stack assembly comprising:
      a plurality of semiconductor modules; and
      a plurality of cooling pipes for cooling the semiconductor modules, the semiconductor modules and the cooling pipes being stacked in a first direction as a stack direction to constitute the stack assembly; and
   a direct-current busbar assembly,
   each of the semiconductor modules comprising:
      a converter component comprising at least one semiconductor element for power conversion; and
      a pair of direct-current terminals connected to the at least one semiconductor element and configured to protrude from the converter component in a second direction serving as a protrusion direction,
   the direct-current busbar assembly comprising:
      a pair of near and far direct-current busbars serving as a current path between a direct-current power source and the semiconductor modules; and
      an insulation member interposed between a first portion of the near direct-current busbar and a second portion of the far direct-current busbar in the protrusion direction, the first and second portions of the respective near and far direct-current busbars respectively serving as first and second overlap portions that are overlapped with each other via the insulation member in the protrusion direction,
   the first overlap portion of the near direct-current busbar being located closer to the converter component in the protrusion direction than the second overlap portion of the far direct-current busbar is,
   the direct-current terminals including:
      a near direct-current terminal; and
      a far direct-current terminal,
   the near direct-current terminal being arranged to be closer to the first and second overlap portions than the far direct-current terminal is in a third direction as an arrangement direction perpendicular to both the stack direction and the protrusion direction,
   the near and far direct-current busbars being joined to the respective near and far direct-current terminals,
   the far direct-current busbar being configured to be joined to the far direct-current terminals of the respective semiconductor modules while bypassing the near direct-current terminals of the respective semiconductor modules.

2. The power converter according to claim 1, wherein:
   the far direct-current busbar is configured to extend beyond the near direct-current terminals of the respective semiconductor modules so as to be joined to the far direct-current terminals of the respective semiconductor modules.

3. The power converter according to claim 1,
   wherein the far direct-current busbar comprises:
      the second overlap portion; and
      a cover portion configured to continuously extend from the second overlap portion to cover the near direct-current terminals of the respective semiconductor modules from one side of the protrusion direction;
   the cover portion having a thickness in the protrusion direction;
   the far direct-current busbar comprises an inclined portion configured to continuously extend from the cover portion such that the inclined portion is inclined to be closer to the converter component as the inclined portion approaches the far direct-current terminals of the respective semiconductor modules; and
   the far direct-current busbar comprises a joint portion configured to continuously extend from the inclined portion to be joined to the far direct-current terminals of the respective semiconductor modules.

4. The power converter according to claim 3, wherein:
   the inclined portion of the far direct-current busbar comprises a plurality of slits formed therethrough in the protrusion direction, the inclined portion being arranged such that the slits are located to be adjacent to the respective near direct-current terminals in the arrangement direction.

5. The power converter according to claim 4, wherein:
   each of the slits of the inclined portion is configured to extend from the inclined portion to the cover portion, so that each of the slits has an extending part located at the cover portion;
   each of the near direct-current terminals has at least opposing two sides and an end side in the protrusion direction, the two sides and end side constituting first and second corners;
   the first corner of each of the near direct-current terminals is located to be closer to the corresponding far terminal than the second corner is; and
   each of the slits is configured to enable the first corner of each near direct-current terminal to be visible through the extending part of the corresponding slit.

6. The power converter according to claim 4, wherein:
   the joint portion of the far direct-current busbar comprises a plurality of through holes formed therethrough in the protrusion direction, the through holes being arranged to continuously communicate with the respective slits.

7. The power converter according to claim 6, wherein:
   each of the slits has a minimum width in the stack direction:
   each of the through holes has a minimum width in the stack direction; and
   the minimum width of each of the slits is longer than the minimum width of the corresponding one of the through holes.

8. The power converter according to claim 3, wherein:
   the cover portion comprises:

a second inclined portion configured to continuously extend from the second overlap portion such that the second inclined portion is inclined to be farther from the converter component as the second inclined portion approaches the near direct-current terminals of the respective semiconductor modules; and a flat plate portion configured to continuously extend from the second inclined portion in a substantially parallel to the arrangement direction so as to be joined to the inclined portion.

9. The power converter according to claim 5, wherein:
the first and second corners of each of the near direct-current terminals are tapered from the end side toward the respective two sides.

10. The power converter according to claim 5, wherein:
the first and second corners of each of the near direct-current terminals are rounded so as to be curvedly tapered from the end side toward the respective two sides.

* * * * *